United States Patent
Sidiropoulos et al.

(10) Patent No.: US 7,532,697 B1
(45) Date of Patent: May 12, 2009

(54) METHODS AND APPARATUS FOR CLOCK AND DATA RECOVERY USING A SINGLE SOURCE

(75) Inventors: Stefanos Sidiropoulos, Palo Alto, CA (US); Marc J. Loinaz, Palo Alto, CA (US)

(73) Assignee: Net Logic Microsystems, Inc., Mountain View, CA (US)

( * ) Notice: Subject to any disclaimer, the term of this patent is extended or adjusted under 35 U.S.C. 154(b) by 575 days.

(21) Appl. No.: 11/044,478

(22) Filed: Jan. 27, 2005

(51) Int. Cl.
*H03D 3/24* (2006.01)
(52) U.S. Cl. ........................... 375/376; 375/327
(58) Field of Classification Search ............... 375/326, 375/371, 373, 376
See application file for complete search history.

(56) References Cited

U.S. PATENT DOCUMENTS

| | | |
|---|---|---|
| 3,601,543 A | 8/1971 | Maniere et al. |
| 4,110,558 A | 8/1978 | Kageyama et al. |
| 4,314,212 A | 2/1982 | Gradl |
| 4,507,629 A | 3/1985 | Frank |
| 4,586,010 A | 4/1986 | Linnenbrink |
| 4,621,242 A | 11/1986 | Theall et al. |
| 5,124,670 A | 6/1992 | Lawton |
| 5,471,162 A | 11/1995 | McEwan |
| 5,519,342 A | 5/1996 | McEwan |
| 5,559,474 A | 9/1996 | Matsumoto et al. |
| 5,712,882 A | 1/1998 | Miller |
| 5,864,250 A * | 1/1999 | Deng .................... 327/165 |
| 6,125,157 A | 9/2000 | Donnelly et al. |
| 6,167,467 A | 12/2000 | Itoh |
| 6,226,332 B1 | 5/2001 | Agazzi et al. |
| 6,242,990 B1 | 6/2001 | Sokolov |
| 6,285,726 B1 | 9/2001 | Gaudet |

(Continued)

OTHER PUBLICATIONS

Sidiropoulos et al., Adaptive Bandwidth DLLs and PLLs using Regulated Supply CMOS Buffers, 2000 Symposium on VLSI Circuits Digest of Technical Papers.

(Continued)

*Primary Examiner*—Emmanuel Bayard
(74) *Attorney, Agent, or Firm*—Stattler-Suh PC (57) ABSTRACT

A receiver circuit reduces the need for external clock sources such as crystal oscillators. The receiver circuit makes use of only a single source, the data input, for performing clock and data recovery. A clock and data recovery circuit receives data and at least one reference clock. The clock and data recovery circuit recovers the clock for the input data using the data input and a reference clock. A clean-up phase lock loop circuit reduces jitter in the recovered clock. The recovered clock from the clock and data recovery circuit is input to the clean-up phase lock loop to produce a clean clock. The clean clock is feed into a clock reference circuit. The clock reference circuit generates the reference clock for the clock and data recovery circuit. As such, the reference clock is based on feed back from the recovered clock. The clock and data recovery circuit obtains a meta-stable state because the loop bandwidth of the clean-up phase lock loop is substantially less than a loop bandwidth for the phase lock loop in the clock reference generator circuit. A clock and data recovery circuit, which does not use a clean-up phase lock loop, is also disclosed. For this configuration, the recovered clock, output from the clock and data recovery circuit, is input directly to the clock reference circuit.

14 Claims, 11 Drawing Sheets

U.S. PATENT DOCUMENTS

| | | |
|---|---|---|
| 6,317,008 B1 | 11/2001 | Gabara |
| 6,466,098 B2 | 10/2002 | Pickering |
| 6,565,157 B2 | 5/2003 | Amick et al. |
| 6,570,946 B1 | 5/2003 | Homol et al. |
| 6,631,144 B1 * | 10/2003 | Johansen .................... 370/516 |
| 6,674,824 B1 | 1/2004 | Chiueh et al. |
| 6,693,496 B1 | 2/2004 | Lebouleux |
| 6,828,864 B2 | 12/2004 | Maxim et al. |
| 6,901,126 B1 | 5/2005 | Gu |
| 6,927,611 B2 | 8/2005 | Rhee et al. |
| 6,961,546 B1 | 11/2005 | Rofougaran |
| 6,967,513 B1 | 11/2005 | Balboni |
| 6,999,543 B1 * | 2/2006 | Trinh et al. ................. 375/355 |
| 7,054,404 B2 | 5/2006 | Saeki |
| 7,078,946 B2 | 7/2006 | Van der Valk et al. |
| 7,088,534 B2 | 8/2006 | Sutardja |
| 7,089,444 B1 * | 8/2006 | Asaduzzaman et al. ..... 713/600 |
| 7,161,443 B2 | 1/2007 | Chen |
| 7,162,002 B2 | 1/2007 | Chen et al. |
| 7,317,360 B2 | 1/2008 | Keaveney |
| 7,323,916 B1 | 1/2008 | Sidiropoulos et al. |
| 2001/0043649 A1 | 11/2001 | Farjad-Rad |
| 2003/0081709 A1 | 5/2003 | Ngo |
| 2003/0086501 A1 | 5/2003 | Dreps et al. |
| 2003/0091139 A1 * | 5/2003 | Cao ........................... 375/376 |
| 2003/0161430 A1 | 8/2003 | Sou |
| 2003/0182481 A1 | 9/2003 | Schoenborn |
| 2004/0202266 A1 * | 10/2004 | Gregorius et al. ........... 375/355 |
| 2005/0111843 A1 * | 5/2005 | Takeuchi et al. .............. 398/38 |
| 2006/0023602 A1 * | 2/2006 | Rauschmayers ......... 369/59.19 |

OTHER PUBLICATIONS

Mansuri et al., A Low-Power Low-Jitter Adaptive-Bandwidth PLL and Clock Buffer, ISSCC 2003/Session 24/Clock Generation/Paper 24.5, ISSCC 2003/Feb. 12, 2003/Salon 8/3:45PM, 2003 International Solid-State Circuits Conference.

Mansuri et al. Jitter Optimization Based On Phase-Locked Loop Design Parameters, IEEE Journal Of Solid-State Circuits, vol. 37, No. 11, Nov. 2002.

Maxim et al., A Low-Jitter 125-1250-MHz Process-Independent and Ripple-Poleless 0.18-μm CMOS PLL Based on a Sample-Reset Loop Filter, IEEE Journal Of Solid-State Circuits, vol. 36, No. 11, Nov. 2001.

Maneatis, Self-Biased High-Bandwidth Low-Jitter 1-to-4096 Multiplier Clock Generator PLL, IEEE Journal Of Solid-State Circuits, vol. 38, No. 11, Nov. 2003.

Sidiropoulos, A Semidigital Dual Delay-Locked Loop, IEEE Journal Of Solid-State Circuits, vol. 32, No. 11, Nov. 1997.

* cited by examiner

METHODS AND APPARATUS FOR CLOCK AND DATA RECOVERY USING A SINGLE SOURCE

BACKGROUND

1. Field

The present invention is directed toward the field of data communications, and more particularly toward clock and data recovery techniques.

2. Art Background

Electronic circuits utilize serial data transmission to transmit data among one or more circuits. In general, serial data transmission involves transmitting bits in a single bit stream at a predetermined data rate. The data rate is expressed as the number of bits transmitted per second ("bps"). Typically, to transfer data between circuits, the sending circuit employs a transmitter that modulates and sends data using a local clock. The local clock provides the timing for the bit rate. The receiving circuit employs a receiver to recover the data, and in some cases, the clock. The receiver circuit recovers the serial bit stream of data by sampling the bit stream at the specified data rate.

Techniques have been developed in an attempt to maximize the efficiency of serial data transfer. Some techniques recover the data at the receiver without receiving the sampling clock from the transmitter (i.e., a separate clock is generated at the receiver). For example, serial data links "over sample" the data to recover clock and data. In one over sampling method, the incoming data is first sampled at the bit cycle transition point to determine whether the phase of the clock at the receiver leads or lags the phase of the bit transitions in the serial bit stream. In addition, the serial bit stream is sampled at the center of the bit cycle to determine the state or value of the data for that bit cycle. Other techniques to recover the clock at the receiver from a serial bit stream include interpolating clock and data recovery and a conventional voltage controlled oscillator ("VCO") based techniques.

These clock and data recovery techniques require one or more reference clocks. For example, the over sampling method requires a reference clock circuit to generate multiple reference clocks. Each reference clock has a different phase for sampling the input data stream. Typically, the reference clocks are generated with the use of expensive crystal oscillators ("XOs") or voltage controlled crystal oscillators ("VCXOs"). It is desirable to reduce or eliminate the need for expensive reference clock sources in a clock and data recovery circuit.

Some clock and data recovery circuits employ a clean-up clock circuit. The clean-up clock circuit filters high frequency components on the clock recovered from the clock and data recovery circuit. The cleaned-up clock (the output of the clean-up clock circuit) is subsequently used in applications that require low jitter in the clock signal. The clean-up circuit is typically implemented using an integrated circuit external to the clock and data recovery circuit plus a voltage controlled crystal oscillator. It is desirable to use a clean-up clock circuit without adding an additional integrated circuit to the receiver. It is also desirable to use a clean-up clock circuit without requiring an additional clock source, such as a voltage controlled crystal oscillator.

SUMMARY

A receiver circuit reduces the need for external clock sources, such as crystal oscillators. The receiver circuit uses only a single source, the data input, for performing clock and data recovery. A clock and data recovery circuit receives data and at least one reference clock. The clock and data recovery circuit recovers the clock for the input data using the data input and a reference clock. A clean-up phase lock loop circuit reduces jitter in the recovered clock. The recovered clock from the clock and data recovery circuit is input to the clean-up phase lock loop to produce a clean clock. The clean clock is feed into a clock reference circuit. In one embodiment, the clock reference circuit generates the reference clock for the clock and data recovery circuit. As such, the reference clock is based on feed back from the recovered clock. The clock and data recovery circuit obtains a stable state because the loop bandwidth of the clean-up phase lock loop is substantially less than a loop bandwidth for the phase lock loop in the clock reference generator circuit.

The clock and data recovery circuit may implement any type of clock and data recovery technique. For example, the clock and data recovery circuit may implement an interpolating clock and data recovery circuit, a conventional voltage-controlled oscillator clock and data recovery circuit, and an over-sampling clock and data recovery circuit.

In another embodiment, a clean-up phase lock loop is not used. For this embodiment, the recovered clock, output from the clock and data recovery circuit, is input directly to the clock reference circuit. While no clock clean-up function is performed in this embodiment, the external clock source is eliminated.

DETAILED DESCRIPTION

A clock and data recovery circuit does not use an external clock source to recover a clock from a serial bit stream. In one embodiment, the clock and data recovery circuit is coupled to a clean-up phase lock loop. A clock, recovered from the serial bit stream in the clock and data recovery circuit, is input to the clean-up phase lock loop. The output clean clock from the clean-up phase lock loop is fed into a clock reference generator. The clock reference generator uses the clean clock to generate the reference clocks for the clock and data recovery circuit.

Figure 1:
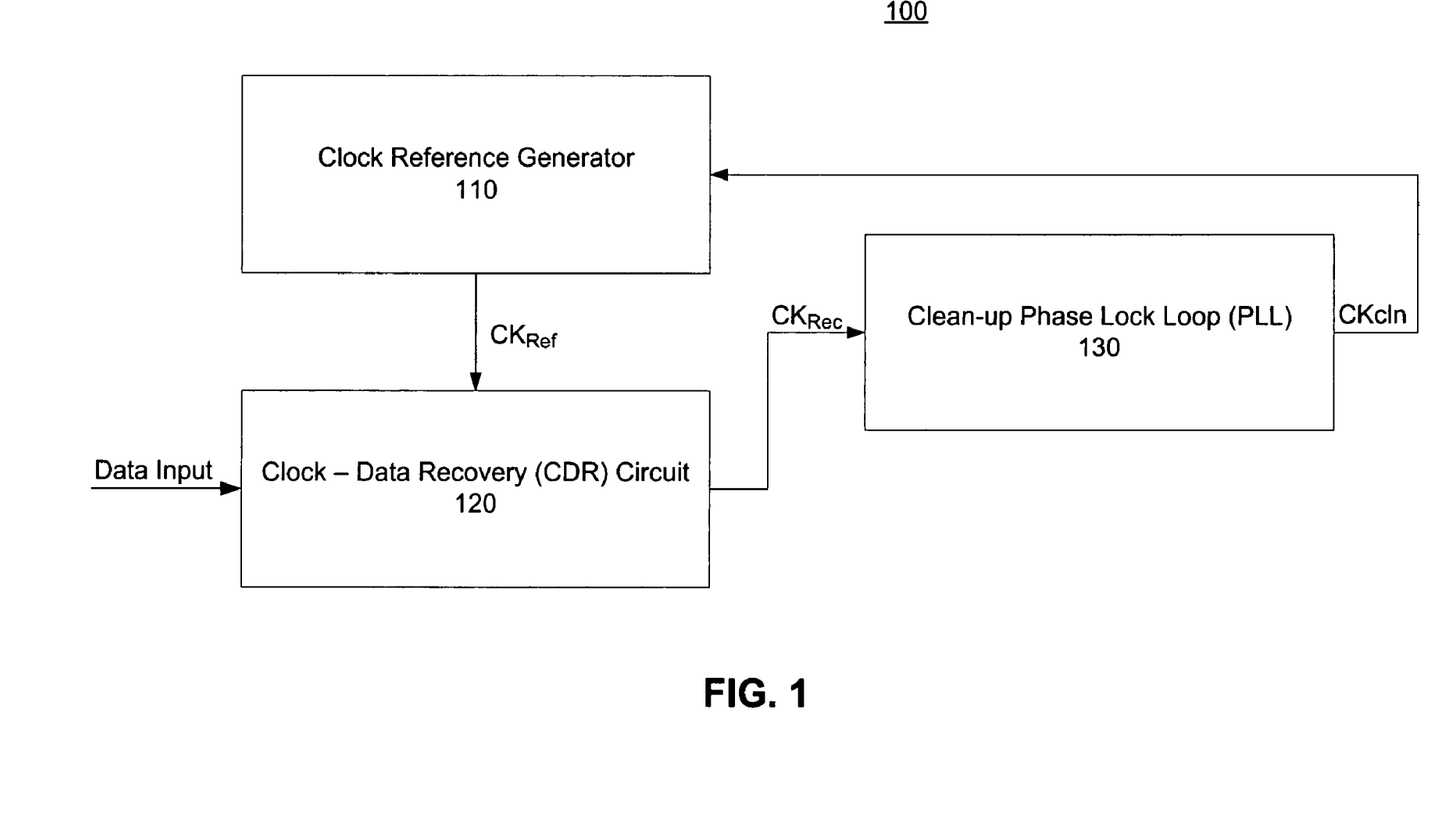
FIG. 1 is a block diagram illustrating one embodiment of the clock and data recovery circuit of the present invention.

FIG. 1 is a block diagram illustrating one embodiment of the clock and data recovery technique of the present invention. A clock and data recovery circuit 120 receives data input (e.g., serial bit stream) and a reference clock. In turn, clock and data recovery circuit 120 generates a recovered clock ($CK_{Rec}$). Clock and data recovery circuit may comprise any time of clock and data recovery circuit. Embodiments for an interpolating CDR, conventional voltage controlled oscillator and over sampling CDR circuits are described below. For this embodiment, the recovered clock, $CK_{Rec}$, is input to clean-up phase lock loop circuit 130. In one embodiment, the recovered clock, $CK_{Rec}$, is divided by a positive value to generate a lower frequency clock. In general, clean-up phase locked loop circuit 130 filters high frequency components of the recovered clock, so as to produce a jitter free or clean clock ($Ck_{cln}$).

As shown in FIG. 1, a clean clock is input to clock reference generator 110. In one embodiment, clock reference generator 110 includes a multiplier circuit to up convert the frequency of the clean clock to generate the frequency of the reference clock (i.e., the reference clock frequency is a multiple of the clean clock frequency). In one embodiment, the clock reference generator 110 uses a phase lock loop to convert the clean clock to the desired reference clock frequency.

Figure 2:
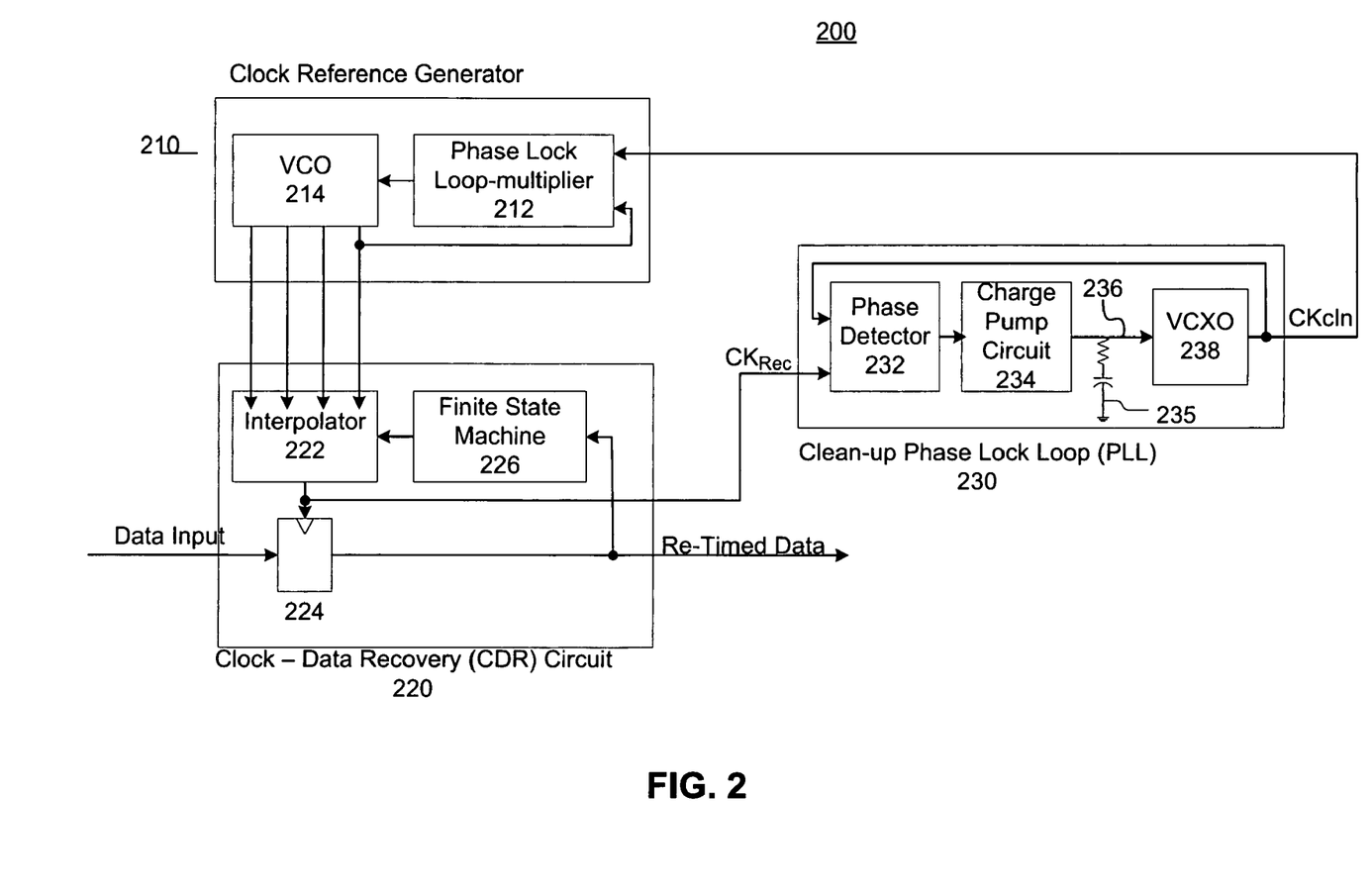
FIG. 2 is a block diagram illustrating one embodiment for an interpolating clock data recovery circuit configured in accordance with the present invention.

FIG. 2 is a block diagram illustrating one embodiment for an interpolating clock and data recovery circuit configured in accordance with the present invention. For this embodiment, clock data recovery circuit 220 is configured as an interpolating clock data recovery ("CDR") circuit. Specifically, CDR circuit 220 includes flip-flop 224, finite state machine 226, and interpolator 222. As shown in FIG. 2, data is input to flip-flop 224, and flip-flop 224 is clocked from the output of interpolator 222. Finite state machine 226 determines a phase correction based on the re-timed data. Based on the data output from flip-flop 224, finite state machine 226 controls interpolator 222 to select one of several reference clock phases. For example, if the data output from flip-flop 224 indicates that the reference clock lags the frequency of the data input, then finite state machine 226 selects a new phase of the reference clock that leads the current phase of the reference clock.

The recovered clock ($CK_{Rec}$), output from clock data recovery circuit 220, is divided to generate a lower frequency clock signal for input to clean-up phase lock loop 230. For the embodiment of FIG. 2., clean-up phase lock loop circuit 230 includes phase detector 232, charge pump circuit 234, capacitor 235, resistor 236, and voltage controlled crystal oscillator ("VCXO") 238. In general, phase lock loop 230 filters high-frequency components from the recovered clock to generate a low jitter clean clock ($Ck_{cln}$). The frequency response of the loop is based on the characteristics of the loop filter (i.e., low pass filter). The phase detector 232 measures the phase difference between the clean clock and the recovered clock, and outputs the phase difference to charge pump circuit 234. Charge pump circuit 234 generates a voltage value based on the phase difference and the state of the loop. The range of voltages generated by charge pump circuit 234 is set based on the desired input operating voltage of VCXO 238. The low pass filter, consisting of resistor 236 and capacitor 235, controls the rate of change in the voltage of charge pump circuit 234. The voltage controls the output frequency generated by the VCXO 238.

The clean clock ($Ck_{cln}$) is input to clock reference generator 210. For the embodiment of FIG. 2, clock reference generator 210 comprises a phase lock loop-multiplier 212 and voltage controlled oscillator ("VCO") 214. The phase lock loop-multiplier 212 also receives a clock from the output of the VCO 214. The phase lock loop-multiplier 212 converts the frequency of the clean clock to the frequency of the input data (i.e., data rate). As shown in FIG. 2, VCO 214 generates multiple phases of the reference clock for input to interpolator 222.

Figure 3:
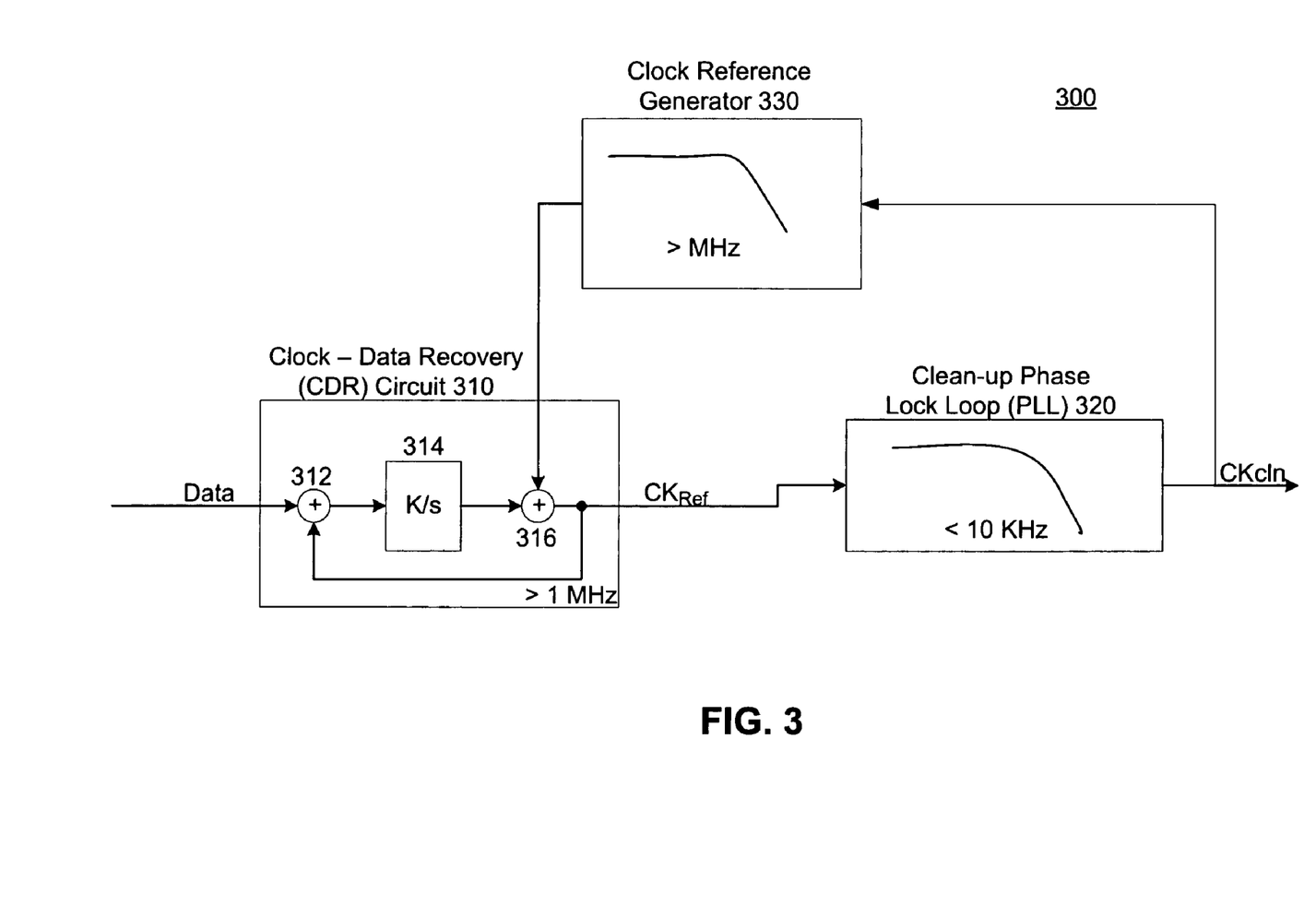
FIG. 3 is a block diagram illustrating a model for the clock and data recovery circuit of the present invention.

FIG. 3 is a block diagram illustrating a model for the clock and data recovery circuit of the present invention. Block 310, labeled clock and data recovery circuit, depicts a Laplace transform model of the clock and data recovery circuit. Blocks 320 and 330, depicting clean-up phase locked loop 320 and clock reference generator 330 respectively, illustrate transfer responses for each phase lock loop. Specifically, the transfer function for the clean-up phase lock loop, implemented with a low pass filter, has a cut off frequency at approximately 10 KHz (i.e., the loop filter attenuates signals greater than 10 KHz). The loop filter characteristic for clock reference generator 330 has a cut off frequency greater than 1 MHz. As such, the bandwidth of the clean-up phase lock loop filter is much less than the bandwidth of the clock reference generator loop. This difference in the bandwidths between the loop filters of the clean-up phase lock loop and the clock reference generator guarantees the stability of the overall circuit.

The feedback configuration of the clock and data recovery circuit of the present invention requires a relatively small locking range for the clean-up phase lock loop. The small locking range of the clean-up phase lock loop permits the phase lock loop of the clock reference generator to lock regardless of the initial state of the clean-up phase lock loop. In one embodiment, the locking range of the clean-up phase lock loop is approximately +/−300 parts per million ("ppm") (i.e., a total range of 600 ppm). For example, when the circuit is initially powered up, the voltage input to voltage controlled crystal oscillator 238 may comprise any voltage value between the rails of the circuit's power supply. However, if the lock range of the clean-up phase lock loop is +/−300 ppm, the clean clock, output from VCXO 238, is no more than 300 ppm from the locking frequency. The clock-data recovery circuit (220) may be designed so that its acquisition range is within the limits of the VCXO output frequency. Thus, in steady state, even if the initial frequency of the VCXO is 300 ppm from the locking frequency, the phase lock loop in the clock reference generator still locks to the frequency of the input data. Even if the clock and data recovery circuit acquisition range is three times smaller than the range of the VCXO, the combined circuit still acquires lock since the output clock of the CDR circuit (220) exhibits an accumulating frequency offset relative to the frequency of the VCXO (238) output clock.

Figure 4:
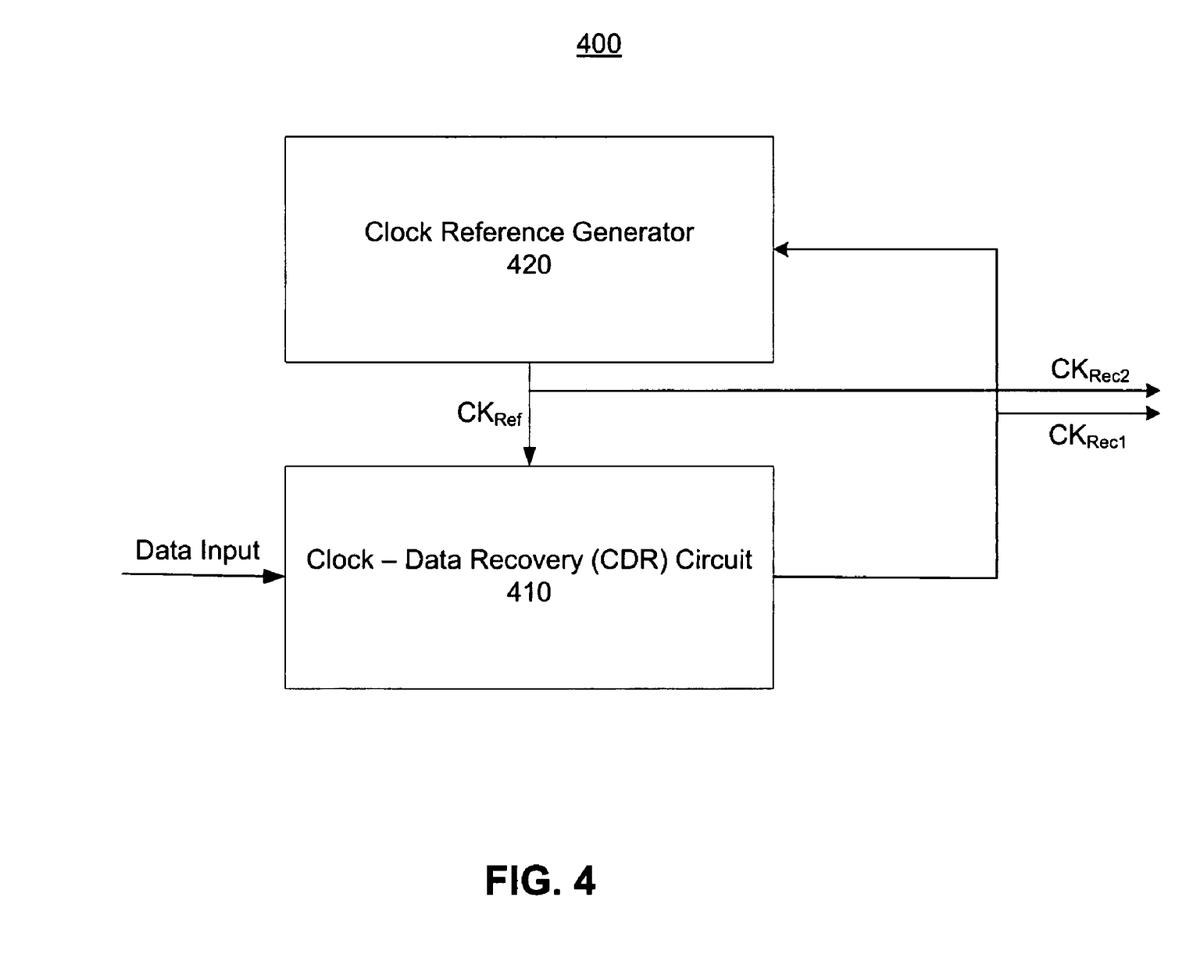
FIG. 4 is a block diagram illustrating another embodiment of the clock and data recovery circuit.

FIG. 4 is a block diagram illustrating another embodiment of the clock and data recovery circuit of the present invention. For this embodiment, a clean-up phase lock loop is not used. Instead, a recovered clock ($CK_{Rec}$), output from clock and recovery circuit 410, is directly input to clock reference generator 420. Similar to the clean-up phase lock loop embodiments, clock reference generator 420 uses the recovered clock to generate the reference clock. After the recovered clock is filtered in clock reference generator 420, the reference clock may also be output as a second recovered clock (i.e., the second recovered clock contains less noise than the first recovered clock due to the signal conditioning in clock reference generator 420). The clock reference generator (420)

is designed so that its initial state is guaranteed to be within the lock range of the clock-data recovery circuit (410). In one embodiment, the clock reference generator design uses various acquisition aids and reset circuits.

Figure 5:
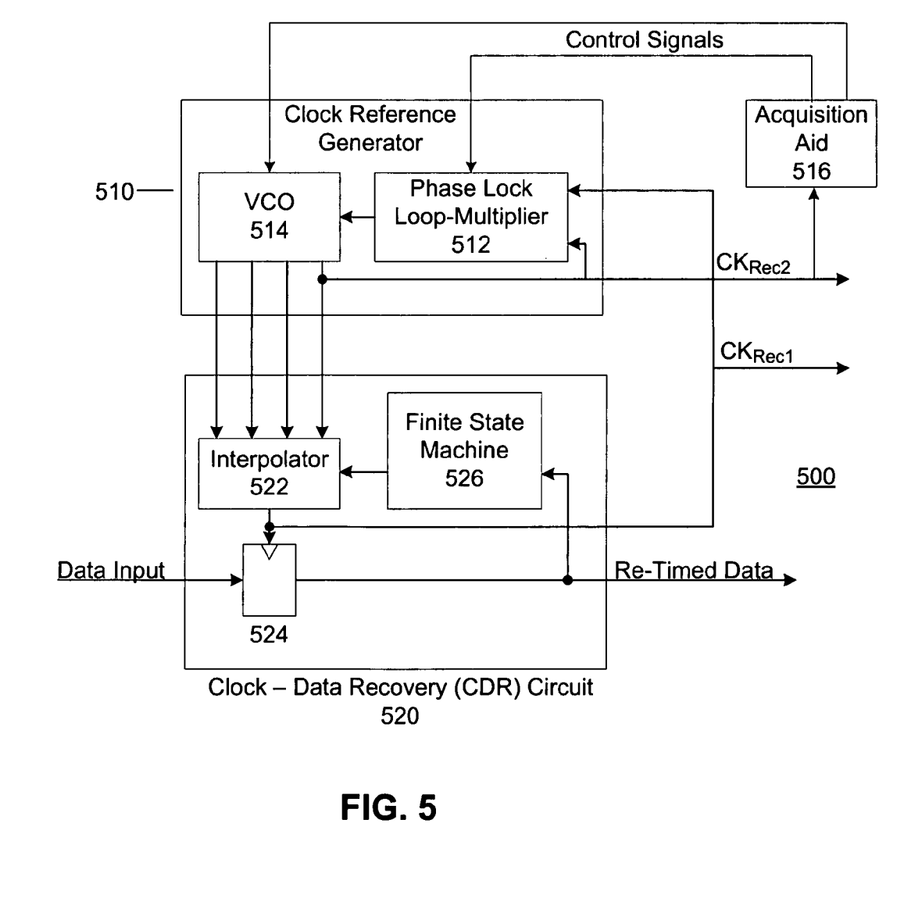
FIG. 5 is a block diagram illustrating one embodiment for an interpolating clock and data recovery circuit in accordance with the present invention.

FIG. 5 is a block diagram illustrating one embodiment for an interpolating clock and data recovery circuit configured in accordance with the present invention. Clock and data recovery circuit 520 is configured as an interpolating clock and data recovery circuit. For this embodiment, clock and data recovery circuit 520 includes flip-flop 524, finite state machine 526 and interpolator 522. The recovered clock, output from clock data recovery circuit 520, is input to phase lock loop circuit 512. Phase lock loop circuit 512 filters or cleans-up the recovered clock. VCO 514 generates multiple phases of the recovered clock for input to interpolator 522. One or more phases of the reference clock may be used as a second recovered clock ($CK_{Rec2}$). Acquisition aid 516 receives, as input, the second recovered clock ($CK_{Rec2}$), and generates control signals for VCO 512 and phase lock loop-multiplier. Acquisition aid 516 controls the start-up of the loop in clock reference generator 510 to ensure proper tracking. As such, acquisition aid 516 is enabled during start-up of the circuit. In one embodiment, acquisition aid 516 generates a control voltage with a value approximately in the middle of the control voltage range for control of VCO 514. The initial control voltage ensures that the phase lock loop in the clock generator acquires a proper lock.

Figure 6:
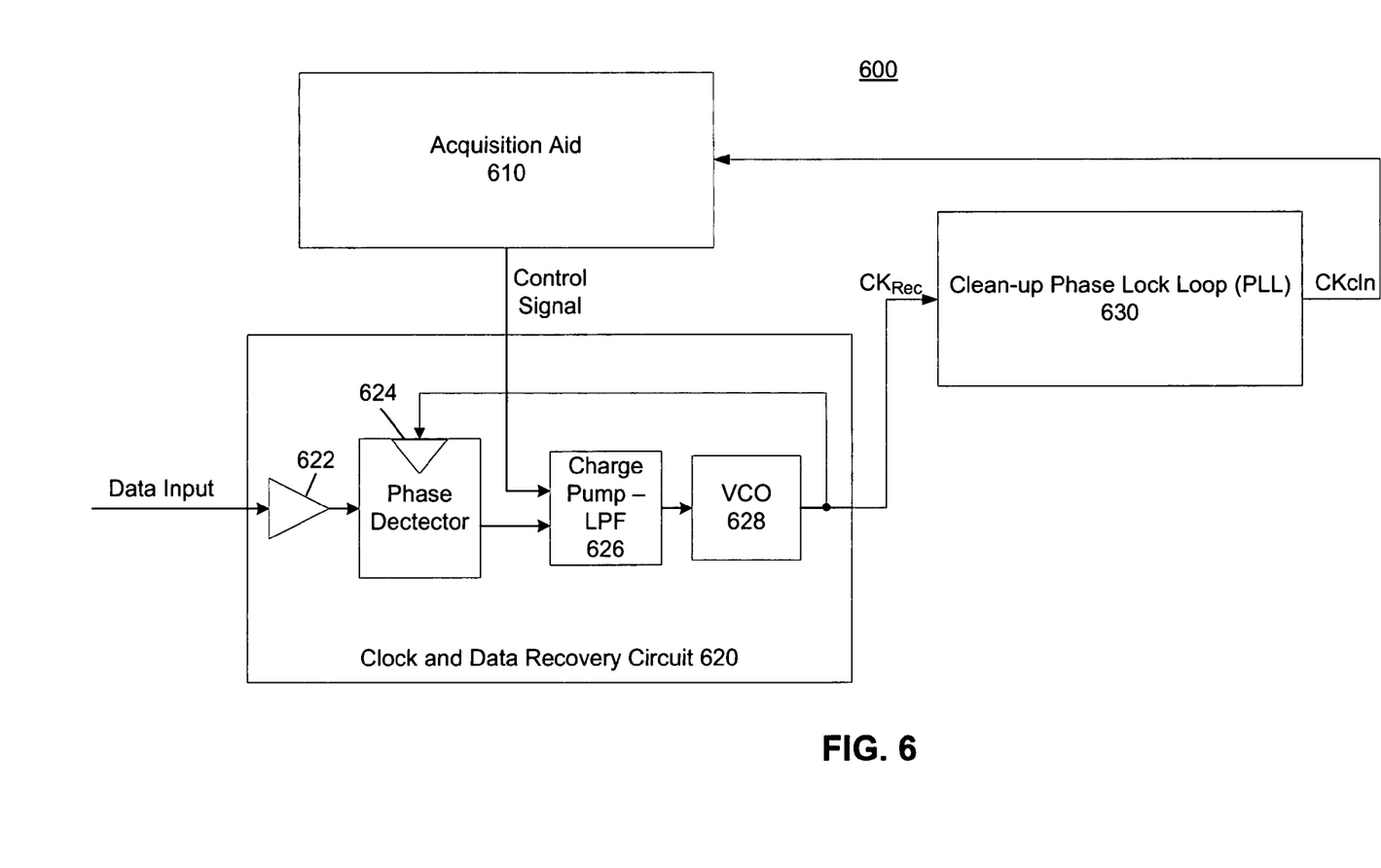
FIG. 6 is a block diagram illustrating one embodiment of a clock data and recovery circuit that uses a conventional voltage controlled oscillator ("VCO").

The present invention has application for use in all types of clock and data recovery circuits. FIG. 6 is a block diagram illustrating one embodiment of a clock data and recovery circuit that uses a conventional voltage controlled oscillator ("VCO"). Data is input to the clock and data recovery circuit 620 along with a control signal from the acquisition aid 610. Specifically, the serial data stream is input to buffer 622. The buffered data stream is subsequently input to phase detector 624. The control signal also input to phase detector 624, is used to guarantee that the clock and data recovery circuit locks to the data input regardless of the start-up state of the elements in the clock and data recovery circuit and the clean-up phase lock loop. The output of phase detector 624 is input to a phase locked loop that includes charge pump-low pass filter 626 and voltage controlled oscillator ("VCO") 628. The recovered clock (CKReC) is input to the clean-up phase locked loop 630 that generates the clean clock ($Ck_{cln}$). In one embodiment, the recovered clock is divided by a positive value for input to clean-up phase lock loop 630. Acquisition aid circuit 610 receives, as input, the clean clock, and generates, as an output, acquisition control signal for the clock data recovery circuit 620. Specifically, acquisition aid 610, enabled during start-up of the circuit, ensures that the phase lock loop in clock and data recovery circuit 620 acquires a proper lock.

Figure 7:
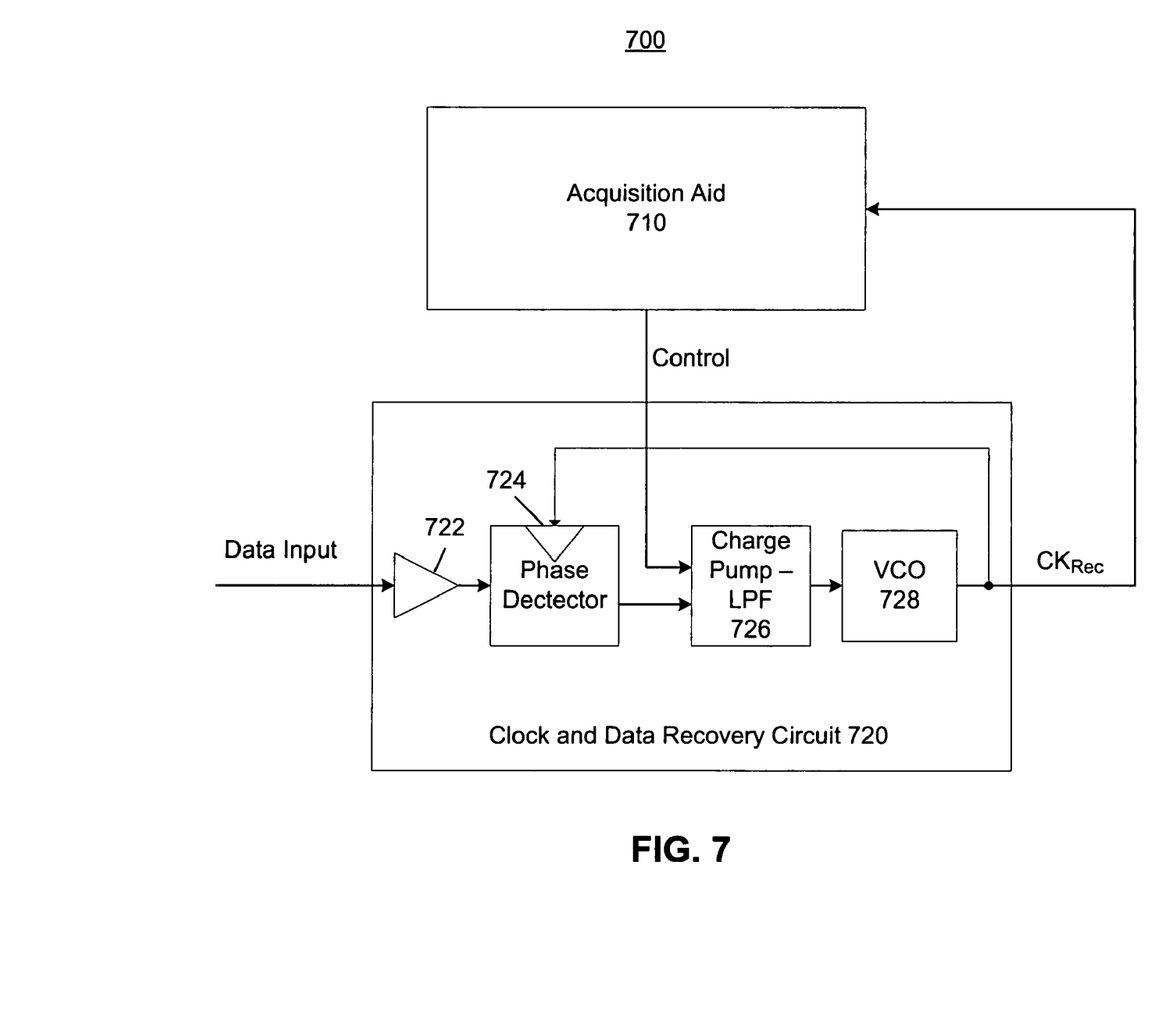
FIG. 7 is a block diagram illustrating another embodiment of a conventional voltage controlled oscillator clock and data recovery circuit configured in accordance with the present invention.

FIG. 7 is a block diagram illustrating another embodiment of a conventional voltage controlled oscillator clock and data recovery circuit configured in accordance with the present invention. For the embodiment of FIG. 7, a clean-up phase lock loop is not used. Instead, the recovered clock, output from clock and data recovery circuit 720, is directly input to acquisition aid 710. Acquisition aid 710 ensures that the phase lock loop in clock and data recovery circuit 720 acquires a proper lock during start-up of the circuit. For example, acquisition aid 710 may generate a control voltage with a value approximately in the middle of the control voltage range for control of VCO 728.

Figure 8:
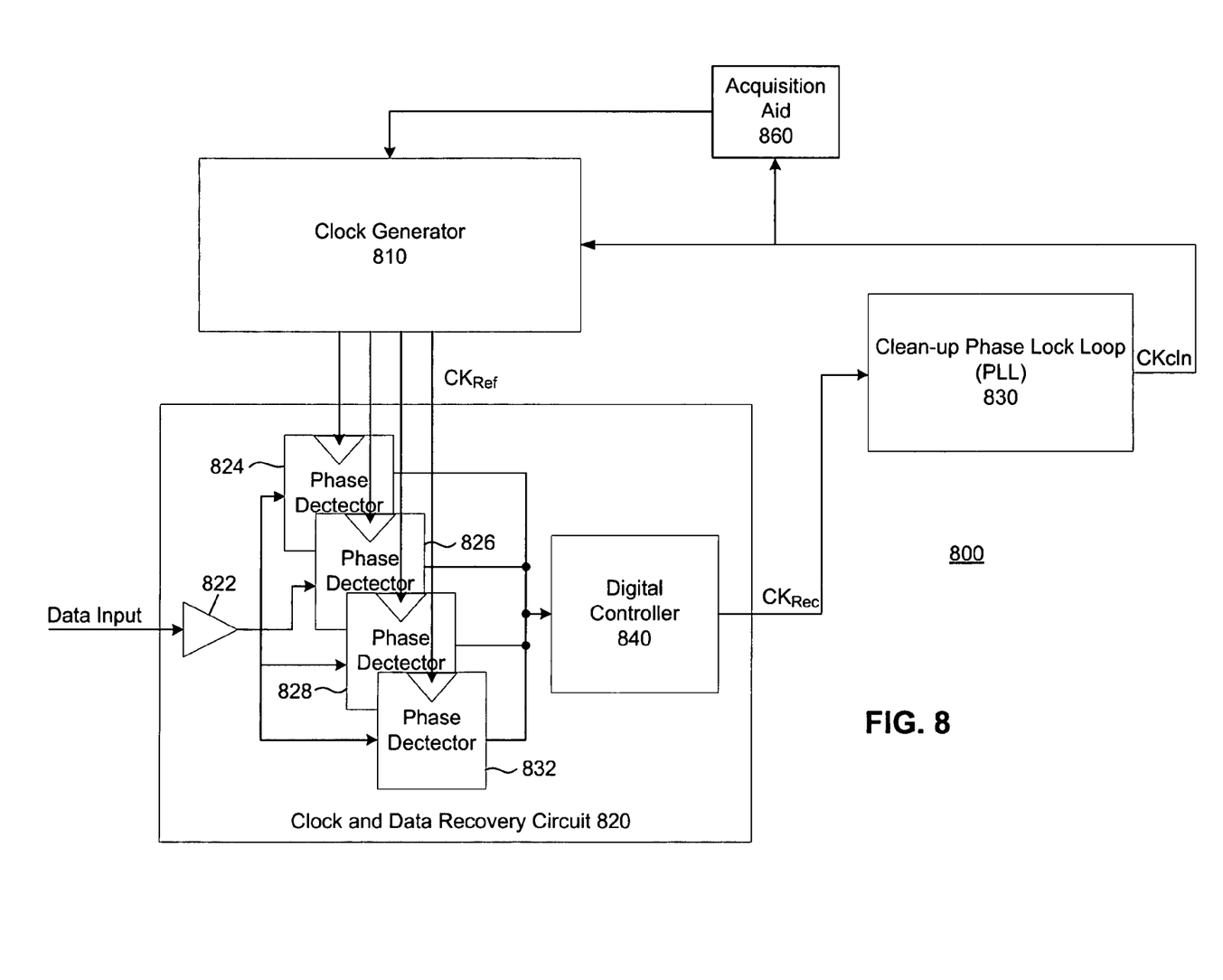
FIG. 8 is a block diagram illustrating one embodiment of an over sampling clock and data recovery circuit configured in accordance with the present invention.

FIG. 8 is a block diagram illustrating one embodiment of an over sampling clock and data recovery circuit configured in accordance with the present invention. The over sampling implementation for clock and data recovery circuit 820 includes buffer 822, phase detectors (824, 826, 828 and 832) and digital controller 840. Clock and data recovery circuit 820 receives multiple reference clocks from clock generator 810. The reference clocks have different phases. Data input to clock and data recovery circuit 820 is sampled by the multiple clock phases in phase detectors (824-832). The samples, output from the phase detectors, are input to digital controller 840. In general, digital controller 840 uses the samples to determine clock timing for the input data.

As shown in FIG. 8, the recovered clock ($CK_{Rec}$) is input to clean-up phase lock loop circuit 830. The clean-up phase lock loop circuit 830 generates a clean clock ($Ck_{cln}$) for input to clock generator 810. Also, the clean clock ($Ck_{cln}$) is input to acquisition aid 860. Acquisition aid 860 generates control signals for clock generator 810 to ensure proper tracking of the loop in clock generator 810 by controlling the initial start-up control voltage for the VCO of the loop. Clock generator 810, using the clean clock as the reference clock, generates multiple clock references of different phases used in clock and data recovery circuit 820.

Figure 9:
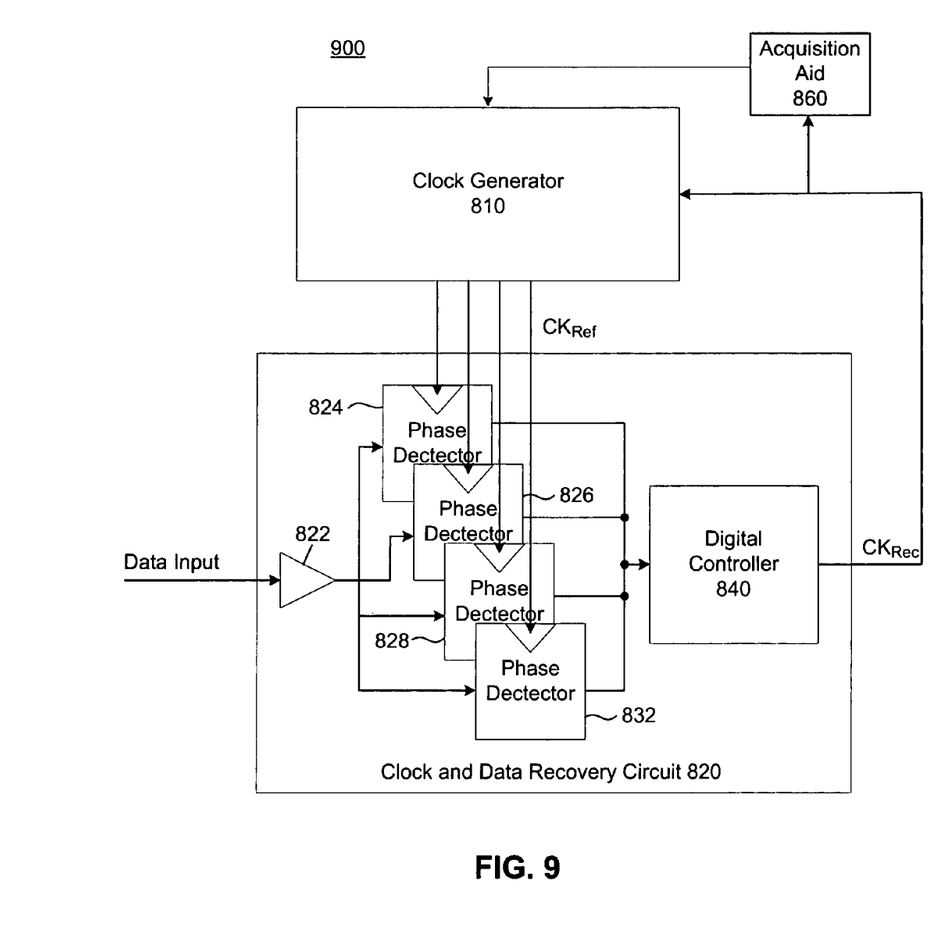
FIG. 9 is a block diagram illustrating one embodiment for an over sampling clock and data recovery circuit configured in accordance with the present invention.

FIG. 9 is a block diagram illustrating one embodiment for an over sampling clock and data recovery circuit configured in accordance with the present invention. For this embodiment, the recovered clock, generated in clock and data recovery circuit 820, is directly input to clock generator 810. Using the recovered clock, clock generator 810 generates multiple phases of the reference clock to sample the input data in clock and data recovery circuit 820. Acquisition aid 860 receives the recovered clock ($CK_{Rec}$), and generates control signals for clock generator 810. Acquisition aid 860 controls the start-up conditions of the loop in clock reference generator 810 to ensure the loop acquires a proper lock.

Figure 10:
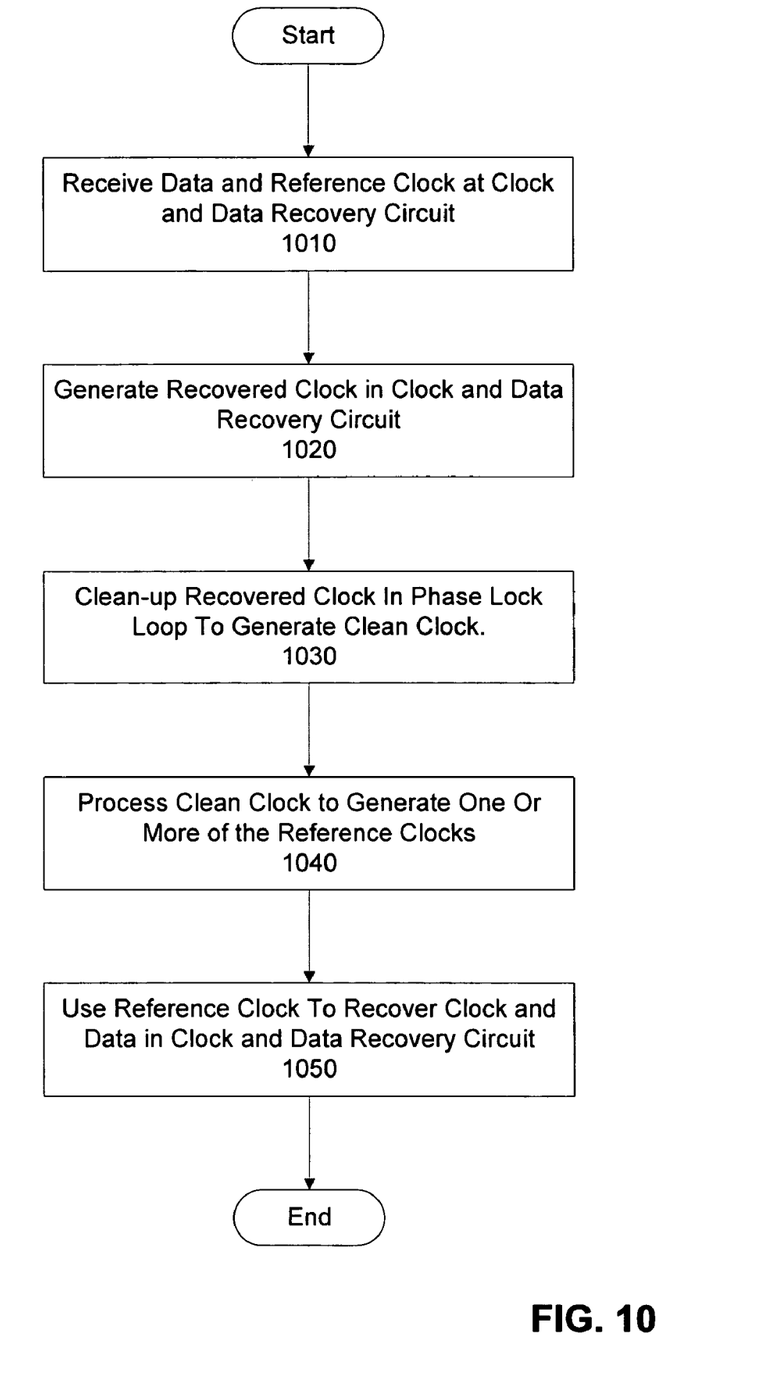
FIG. 10 is a flow diagram illustrating one embodiment for implementing a clock and data recovery technique.

FIG. 10 is a flow diagram illustrating one embodiment for implementing a clock and data recovery technique. Input data and a reference clock are input to the clock and data recovery circuit (block 1010, FIG. 10). The clock and data recovery circuit generates a recovered clock using the input reference clock and the input data (block 1020, FIG. 10). The recovered clock is filtered to reduce jitter in a clean-up phase lock loop, and a clean clock is generated (block 1030, FIG. 10). The clean clock is input to a clock generator circuit that generates one or more of the reference clocks (block 1040, FIG. 10). The reference clocks, generated in the clock generator circuits, are input to the clock and data recovery circuit (block 1050, FIG. 10).

Figure 11:
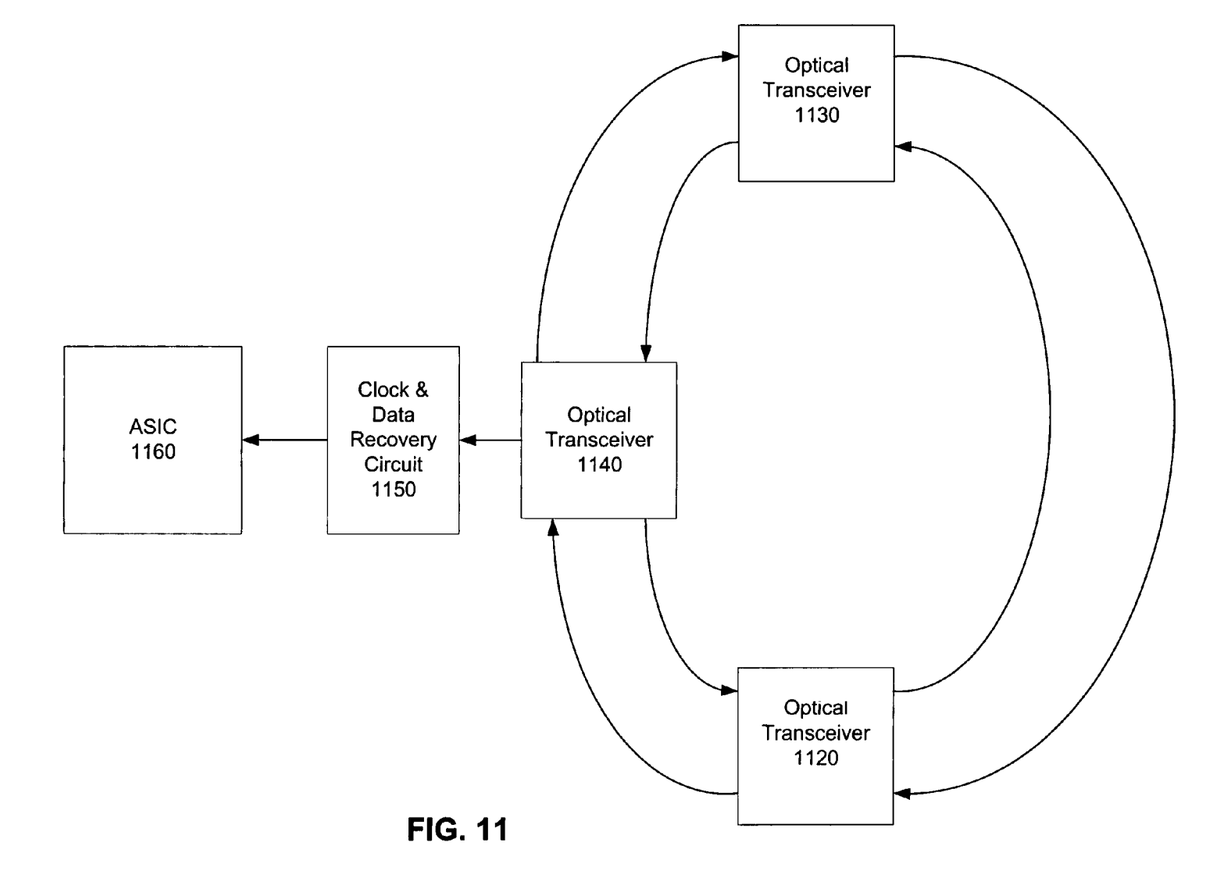
FIG. 11 is a block diagram illustrating one application for the clock and data recovery circuit of the present invention.

FIG. 11 is a block diagram illustrating one application for the clock and data recovery circuit of the present invention. An optical communication system includes a network that has a number of nodes implemented with optical transceivers (1120, 1130 and 1140). The network may be configured in accordance with the synchronous optical network (SONET) standard. The clock and data recovery circuit 1152, shown for one node, is coupled to optical transceiver 1140. Optical transceiver 1140 outputs data streams to data and clock recovery circuit 1150. In turn, the data and clock recovery circuit 1150 generates clock and data for input to a specific application. The application is implemented with an integrated circuit (ASIC) 1160.

For the SONET application, all clocks in the optical module operate at the same frequency as data rate of the incoming data stream. The SONET protocol has limited capabilities for accommodating frequency offsets between optical transceivers. Typically the data rate in the SONET ring is set to a single, well-controlled frequency with the use of satellite-based clock distribution. A clock clean-up circuit (usually based on a VCXO) is therefore used to clock the transmitter within the transceiver. The result is that the transceiver's input and output data rates are identical. The "jitter transfer" bandwidth from data input to data output of the transceiver is constrained by the SONET specification (e.g. jitter transfer bandwidth must be less than 120 kHz for the OC-192 SONET standard). Using a conventional receiver, the optical transceiver makes use of an XO (as an input to the reference generator) and a VCXO (in the clean-up phase lock loop). With the use of the receiver described herein, transceiver 1140 uses only a VCXO, thus saving the cost of the XO.

Those of skill in the art will understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A circuit comprising:
    clock and data recovery circuit for receiving data and at least one reference clock and for generating a recovered clock based on said data input and said reference clock;
    clean-up phase lock loop circuit for receiving said recovered clock and for filtering said recovered clock to generate a clean clock; and
    clock reference generator circuit, coupled to said clock and data recovery circuit and said clean-up phase lock loop, for receiving said clean clock and for generating said clock reference for said clock and data recovery circuit.

2. The circuit as set forth in claim 1, wherein:
    said clock reference generator circuit comprises a phase lock loop; and
    said clean-up phase lock loop comprises a loop bandwidth substantially less than a loop bandwidth for said clock reference generator circuit.

3. The circuit as set forth in claim 1, wherein said clock and data recovery circuit comprises an interpolating clock and data recovery circuit.

4. The circuit as set forth in claim 1, wherein said clock and data recovery circuit comprises a conventional voltage-controlled oscillator clock and data recovery circuit.

5. The circuit as set forth in claim 1, wherein said clock and data recovery circuit comprises an oversampling clock and data recovery circuit.

6. A circuit comprising:
    clock and data recovery circuit for receiving data and at least one reference clock and for generating a recovered clock based on said data input and said reference clock; and
    clock reference generator circuit, coupled to said clock and data recovery circuit, comprising a phase lock loop for receiving said recovered clock and for generating said clock reference; and
    clean-up phase lock loop coupled to receive said recovered clock and for filtering noise from said recovered clock to generate a clean clock for said clock reference said clean-up phase lock loop comprises a loop bandwidth substantially less than a loop bandwidth for said phase lock loop for said clock reference circuit.

7. The circuit as set forth in claim 6, wherein said clock and data recovery circuit comprises an interpolating clock and data recovery circuit.

8. The circuit as set forth in claim 6, wherein said clock and data recovery circuit comprises a conventional voltage-controlled oscillator clock and data recovery circuit.

9. The circuit as set forth in claim 6, wherein said clock and data recovery circuit comprises an oversampling clock and data recovery circuit.

10. A method for clock and data recovery, said method comprising:
    receiving data and at least one reference clock;
    generating a recovered clock based on said data input and said reference clock;
    filtering said recovered clock using a phase lock loop to generate a clean clock; and
    generating said reference clock from said clean clock.

11. The method as set forth in claim 10, wherein generating said reference clock from said clean clock comprises generating said reference clock using a phase lock loop, wherein said phase lock loop used to filter said recovered clock comprises a loop bandwidth substantially less than a loop bandwidth for generating said reference clock.

12. The method as set forth in claim 10, wherein receiving data and at least one reference clock and generating a recovered clock based on said data input and said reference clock comprises using an interpolating clock and data recovery circuit.

13. The method as set forth in claim 10, wherein receiving data and at least one reference clock and generating a recovered clock based on said data input and said reference clock comprises using a conventional voltage-controlled oscillator clock and data recovery circuit.

14. The method as set forth in claim 10, wherein receiving data and at least one reference clock and generating a recovered clock based on said data input and said reference clock comprises using an oversampling clock and data recovery circuit.

* * * * *